Dec. 21, 1965

L. M. MYERS 3,225,262

DUAL-TRANSISTOR HOLDER

Filed Nov. 17, 1964

INVENTOR.
LESTER M. MYERS
BY [signature]
ATTORNEY

United States Patent Office 3,225,262

Patented Dec. 21, 1965

3,225,262

DUAL-TRANSISTOR HOLDER

Lester M. Myers, Cedar Rapids, Iowa, assignor to Collins Radio Company, Cedar Rapids, Iowa, a corporation of Iowa Filed Nov. 17, 1964, Ser. No. 411,773

4 Claims. (Cl. 317—101)

This invention relates in general to a holding means and in particular to a space-saving holder for transistors.

As electronic equipment is made smaller and smaller, it has become necessary to utilize various techniques in mounting components. The present invention relates to transistor or other component mounting devices which may be mounted in a plate or printed circuit board and are formed with openings which pass from opposite sides of the holder at an angle so that the leads from the components extend through the holder so as to miss the component on the other side.

It is an object of this invention to provide a space-saving holder for a component which has offset openings.

Another object is to provide a cheap component holder that may be used to mount a pair of components on opposite sides of a holding plate.

A feature of this invention is found in the provision for a holding means that may be mounted in a plate and which is formed with openings that pass through the holder at an angle so as to allow components to be mounted on either side and through which the leads of the components may extend to be connected to the holding place.

Further objects, features and advantages of this invention will become apparent from the following description and claims when read in view of the accompanying drawings, in which:

Figure 1:
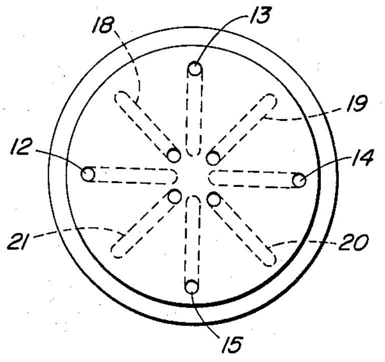
FIGURE 1 is a top plane view of the holder according to this invention.
Figure 2:
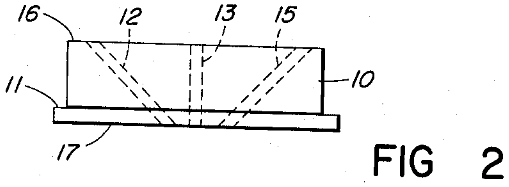
FIGURE 2 is a side view of the holder according to this invention.

FIGURES 1 and 2 illustrate a cylindrical body portion 10 which is formed with a flange 11 on one edge thereof. The body portion 10 might be made of Teflon or other suitable insulating material and is formed with a plurality of openings which extend from either side. For example, openings 12, 13, 14 and 15 extend from side 16 to side 17 of the body portion. These openings are formed at an angle so as to be near the outer diameter on side 16 and near the center of side 17.

A second group of openings 18, 19, 20 and 21 are formed through the body portion 10 and are formed at an angle so that they are near the center on side 16 and near the outer edge on side 17.

Figure 3:
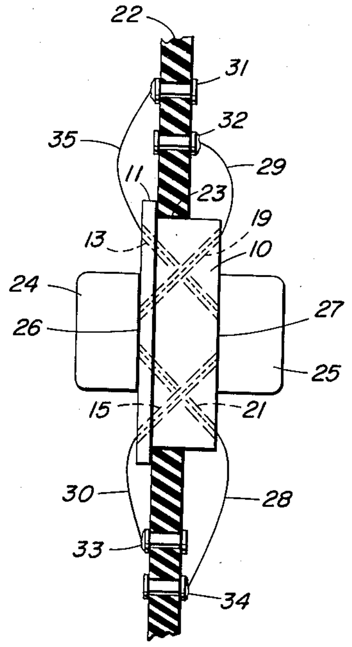
FIGURE 3 is a partially sectioned view of the holder of this invention mounted in a holding plate and with a pair of components mounted thereon.

The holder thus formed may be mounted in a suitable plate or printed circuit board as shown in FIGURE 3. For example, a plate 22 might be a printed circuit board which is formed with an opening 23 in which the body portion 10 of the holder may be inserted. The body portion 10 may be oversized so as to require a press-fit between the plate 22 and body portion 10 and the shoulder 11 engages one side of the plate. The force fit will assure that the holder is tightly held in the plate. Alternatively, the holder may extend through the opening in the plate and upset so as to slightly enlarge its diameter on the right side of FIGURE 3 so as to provide a firm bond between the plate and the holder.

Components 24 and 25 have leads which extend from their bottoms 26 and 27 respectively. For example, component 24 has a pair of leads 28 and 29 which extend respectively through openings 21 and 29 of the holder. Component 25 has at least a pair of leads 30 and 35 which extend through openings 13 and 15 respectively.

Contact grommets 31, 32, 33 and 34 are mounted in plate 22 and leads 27, 28 and 30, 35 are respectively connected to one of these grommets.

It is to be noted that the leads are bent as they leave the holder 10 which assures that the components will be firmly held to the holder by the tension in the leads. The leads may be soldered, for example, to the contact grommets. Although only a pair of leads for each component are shown in FIGURE 3, it is to be realized that the components may have a number of leads. The illustrated holder has four openings extending through each side but the invention is not to be limited to any particular number of openings. By forming the openings through the holder at an angle, the component on the opposite side of the holder is not engaged by the leads from the other component. The body portion is made of insulating material and the leads of both components are insulated from each other so that shorting does not occur.

It is seen that the present invention allows electrical components to be mounted to a plate in a compact, neat and efficient manner.

Although this invention has been described with respect to a particular embodiment thereof, it is not to be so limited, as changes and modifications may be made therein which are within the spirit and scope of the invention as defined by the appended claims.

I claim:

1. A holder for electrical components comprising a body of insulating material, a first plurality of openings formed through the body of insulating material at an angle such that the openings are relatively near the center on one side of the holder and emerge relatively near the edge on the other side of the holder and a second plurality of openings formed through the holder at an angle and said second plurality of openings being relatively near the center on the other side of the holder and emerging near the edge on the one side of the holder.

2. A holder for electrical components comprising a body portion of insulating material formed with a shoulder at one edge thereof, a first plurality of openings formed through the holder, said openings formed at an angle so that they emerge adjacent the edge on the side of the holder which has the shoulder and relatively adjacent the center on the other side of the holder, a second plurality of openings formed through the holder at an angle and said second plurality of openings formed relatively adjacent the center on the side of the holder with the shoulder and emerging relatively near the outer edge on the other side of the holder.

3. In combination, a holding plate, a pair of electrical components, and a holder mounting said pair of components on the holding plate; said holder comprising a body portion of insulating material formed with a shoulder at one edge thereof, a first plurality of openings formed through the holder, said openings formed at an angle so that they emerge adjacent the edge on the side of the holder which has the shoulder and relatively adjacent the center on the other side of the holder, a second plurality of openings formed through the holder at an angle and said second plurality of openings formed relatively adjacent the center on the side of the holder with the shoulder and emerging relatively near the outer edge on the other side of the holder, the holding plate formed with an opening through which the holder extends so that the shoulder engages the plate, and the pair of components each having leads extending through the first and second plurality of openings from opposite sides of the holder and the leads of the components attached to said plate.

4. In apparatus according to claim 3 wherein said holder is generally cylindrical in shape.

References Cited by the Examiner

UNITED STATES PATENTS

| | | | |
|---|---|---|---|
| D. 200,157 | 1/1965 | Vincent. | |
| 2,917,286 | 12/1959 | Deakin. | |
| 3,184,536 | 5/1965 | Vincent | 174—138 |

FOREIGN PATENTS

| | | |
|---|---|---|
| 660,187 | 10/1951 | Great Britain. |

OTHER REFERENCES

The Milton Roos Company, "Firm Footing for Transistors," Electronics, vol. 34, No. 6, Feb. 10, 1961, page 33.

ROBERT K. SCHAEFER, *Primary Examiner.*

LARAMIE E. ASKIN, *Assistant Examiner.*